(12) United States Patent
Lu

(10) Patent No.: US 8,970,294 B2
(45) Date of Patent: Mar. 3, 2015

(54) DISTRIBUTION AMPLIFIER WITH INTELLECTUAL SIGNALING

(71) Applicant: Shan-Jui Lu, Xizhi (TW)

(72) Inventor: Shan-Jui Lu, Xizhi (TW)

(73) Assignee: Lantek Electronics, Inc., Xizhi (TW)

( * ) Notice: Subject to any disclaimer, the term of this patent is extended or adjusted under 35 U.S.C. 154(b) by 8 days.

(21) Appl. No.: 13/677,688

(22) Filed: Nov. 15, 2012

(65) Prior Publication Data

US 2014/0070882 A1  Mar. 13, 2014

(51) Int. Cl.
*H03F 1/42* (2006.01)
*H03F 3/60* (2006.01)
*H04H 20/65* (2008.01)

(52) U.S. Cl.
CPC .................. *H03F 1/42* (2013.01); *H03F 3/602* (2013.01); *H04H 20/65* (2013.01)
USPC ................................. 330/2; 330/53; 330/297

(58) Field of Classification Search
CPC ........... F21L 4/027; F21L 4/02; F21L 14/023; F21K 9/00; G05F 1/10; Y10S 362/80; A61N 1/08; G01D 21/00; G01R 19/00; G09G 2320/064; G09G 2330/028; G09G 3/14; G09G 3/3406; H03F 1/3247; H03F 3/211; H03F 2201/3233; H03F 1/34; H03F 3/602; H03F 3/607; H03F 3/60; H03F 3/605; H03F 3/601; H03F 3/54; H03F 2200/198; H03F 1/50; H03G 3/3042; H04B 3/06
USPC ............................ 330/1, 53, 127, 286, 297, 2
See application file for complete search history.

(56) References Cited

U.S. PATENT DOCUMENTS 7,486,028 B2 *  2/2009  Langeslag et al. ........ 315/209 R

* cited by examiner

*Primary Examiner* — Khanh V Nguyen
(74) *Attorney, Agent, or Firm* — Law Offices of Eugene M. Cummings, P.C.

(57) ABSTRACT

A distribution amplifier with intellectual signaling comprises a first connector, a first amplifier, a second connector, a power regulator, an inductive coil, a voltage detecting circuit, a first indicating lamp, a second amplifier and a second indicating lamp. The distribution amplifier with intellectual signaling may effectively display whether the distribution amplifier operates normally or not according to the above-mentioned arrangement.

19 Claims, 4 Drawing Sheets

DISTRIBUTION AMPLIFIER WITH INTELLECTUAL SIGNALING

TECHNICAL FIELD

The present disclosure relates to a distribution amplifier with intellectual signaling, and more particularly, to a distribution amplifier with intellectual signaling including a voltage detecting circuit, a first indicating lamp and a second indicating lamp, which can effectively indicate whether the distribution amplifier is in a normal operation state or not.

RELATED ART

Currently, home cable television systems enable users to download video signals (at a frequency of about 54 to about 1000 megahertz (MHz)) from a host of the cable television system and to upload information (at a frequency of about 5 to about 42 MHz) from the cable television system to the host by a cable modem or a set top box which is coupled to a cable of the cable television system through a tap, a distributor or a residential amplifier.

The tap or the distributor is generally composed of passive elements without certain functions of a transistor amplifier circuit or indicating lamps. Alternatively, a residential amplifier (or a distribution amplifier) is generally composed of active elements and comprises an indicating lamp for providing the operational status of the residential amplifier. FIG. 1 depicts a schematic view of a circuit for a prior art distribution amplifier. The distribution amplifier often comprises a first connector 210, an amplifier 220, a second connector 230, a power regulator 240, an inductive coil 250 and an indicating lamp 260. When power is turned on, the indicating lamp 260 is turned on for indicating the distribution amplifier is operating in a normal state. During normal operation, a radio-frequency signal (RF signal) is received by the first connector 210, amplified by the amplifier 220, and outputted from the second connector 230.

If the amplifier 220 fails, the RF signal received by the first connector 210 is not amplified by the amplifier 220 and, therefore, an adequate RF signal is not outputted from the second connector 230. However, power is still supplied to the indicating lamp 260, so the indicating lamp 260 is continuously turned on or is illuminated. In this way, engineers cannot determine whether the distribution amplifier is in a normal operation state according to the signaling of the indicating lamp 260, which is a defect of the prior art distribution amplifier.

In response to the above-mentioned defect of the prior art distribution amplifier, the present disclosure provides an improved distribution amplifier having intellectual signaling to improve the above-mentioned defects.

SUMMARY OF THE INVENTION

This disclosure generally describes a distribution amplifier with intellectual signaling having a plurality of indicating lamps for signaling whether the distribution amplifier is operating in a normal operation state or whether the distribution amplifier has failed. The present invention distribution amplifier generally comprises a first connector, a second connector, a first amplifier, a second amplifier, a power regulator, an inductive coil, a voltage detecting circuit, a first indicating lamp, and a second indicating lamp. The first connector is configured to receive an RF signal. The first amplifier includes an input terminal, an output terminal and a power input terminal. The input terminal of the first amplifier is coupled to the first connector, and the first amplifier is generally configured to amplify the RF signal received from the input terminal.

The second connector is coupled to the output terminal of the first amplifier and is configured to output the amplified RF signal. The power regulator is generally configured to stabilize direct current power. Specifically, the power regulator includes a first terminal, a second terminal and a third terminal, wherein the first terminal is connected to a first direct current power, the second terminal is grounded, and the third terminal is configured to output a second direct current power after the voltage of the first direct current power is stabilized by the power regulator. The inductive coil is generally configured to measure the voltage of the power input terminal. Specifically, the inductive coil includes a first terminal and a second terminal, wherein the first terminal of the inductive coil is connected to the second direct current power from the third terminal of the power regulator, and the second terminal of the inductive coil is coupled to the power input terminal of the first amplifier and is configured to measure the voltage of the power input terminal. When the first amplifier is in a normal operation state, a first voltage is detected by the inductive coil; when the first amplifier fails, a second voltage is detected by the inductive coil. The voltage detecting circuit, including a terminal coupled to the second direct current power from the third terminal of the power regulator, is configured to output a control signal according to the voltage detected by the inductive coil. When the first voltage (signaling a normal operation state) is detected, the voltage detecting circuit outputs a control signal with a high voltage level.

When the second voltage (signaling that the first amplifier has failed) is detected, the voltage detecting circuit outputs a control signal with a low voltage level.

A first indicating lamp is provided to signal whether the distribution amplifier is operating in a normal operation state. Specifically, the first indicating lamp includes a first terminal and a second terminal, the first terminal is coupled to the control signal from the voltage detecting circuit, and the second terminal is grounded. When the first indicating lamp receives a control signal at a high voltage level (signaling a normal operation state), the first indicating lamp is turned on or is illuminated. When the first indicating lamp receives a control signal at a low voltage level (signaling that the first amplifier has failed), the first indicating lamp is turned off or is not illuminated.

A second indicating lamp is further provided to signal whether the distribution has failed. Specifically, a second amplifier is further provided which includes a first terminal, a second terminal and a third terminal. Specifically, the first terminal of the second amplifier is adapted to receive the control signal from the voltage detecting circuit and is coupled to the first terminal of the first indicating lamp. The second terminal of the second amplifier is grounded. The third terminal of the second amplifier is coupled to the first direct current power via a resistor. The second indicating lamp is coupled to the second amplifier, wherein its first terminal is coupled to the third terminal of the second amplifier, and its second terminal is grounded. When the second amplifier receives a control signal at a high voltage level (signaling a normal operation state), the second amplifier is conducted such that the second indicating lamp is turned off. When the second amplifier receives a control signal at a low voltage level (signaling that the first amplifier has failed), the second amplifier is cut off such that the second indicating lamp is turned on.

BRIEF DESCRIPTION OF THE DRAWINGS

The disclosure will become more fully understood from the detailed description given herein below for illustration only, and thus are not limitative of the present disclosure, and wherein.

DETAILED DESCRIPTION

The detailed features and advantages of the disclosure are described below in great detail through the following embodiments, the content of the detailed description is sufficient for those skilled in the art to understand the technical content of the disclosure and to implement the disclosure there accordingly. Based upon the content of the specification, the claims, and the drawings, those skilled in the art can easily understand the relevant objectives and advantages of the disclosure.

Figure 1:
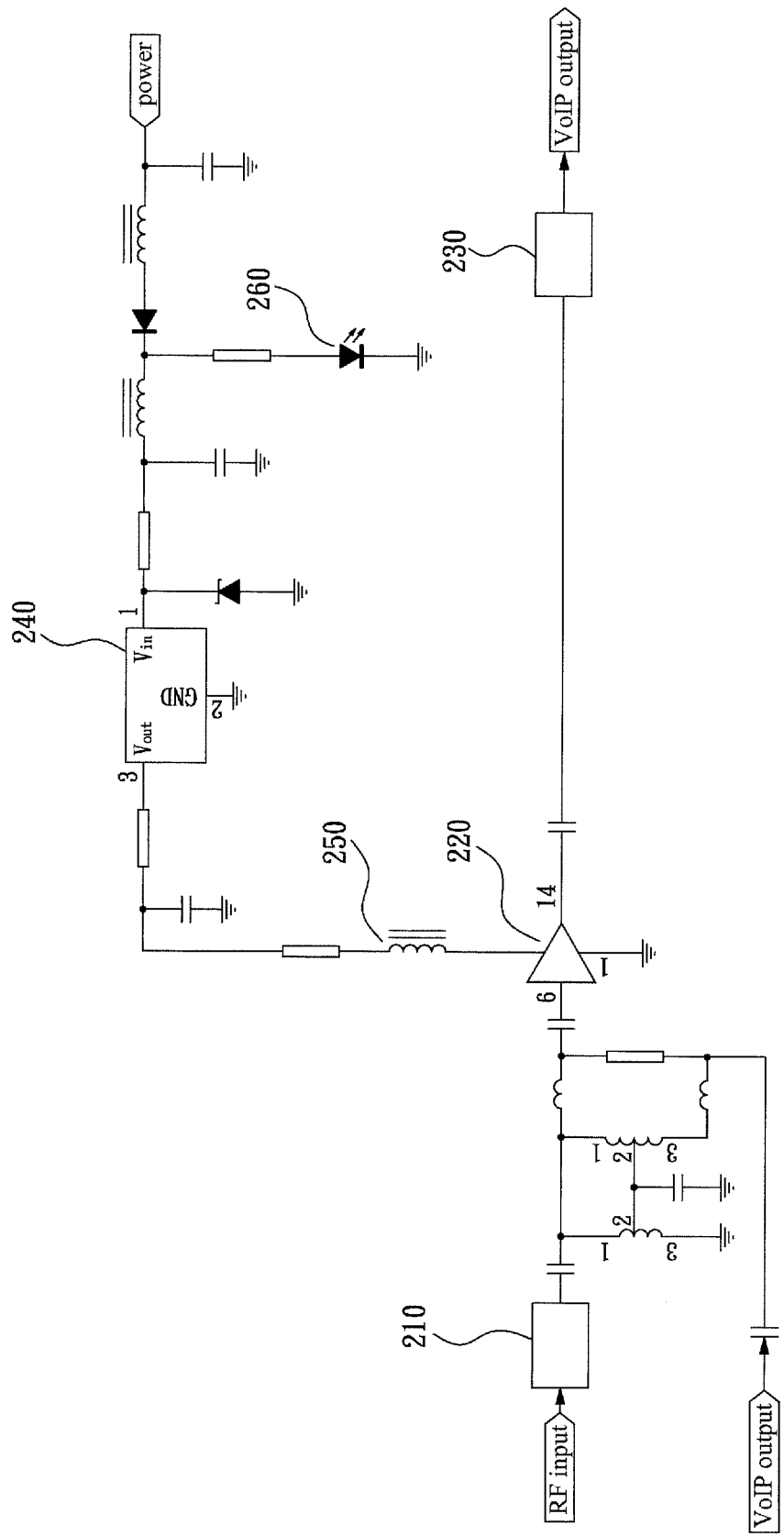
FIG. 1 is a schematic view depicts a circuit of an amplifier in prior art.
Figure 2:
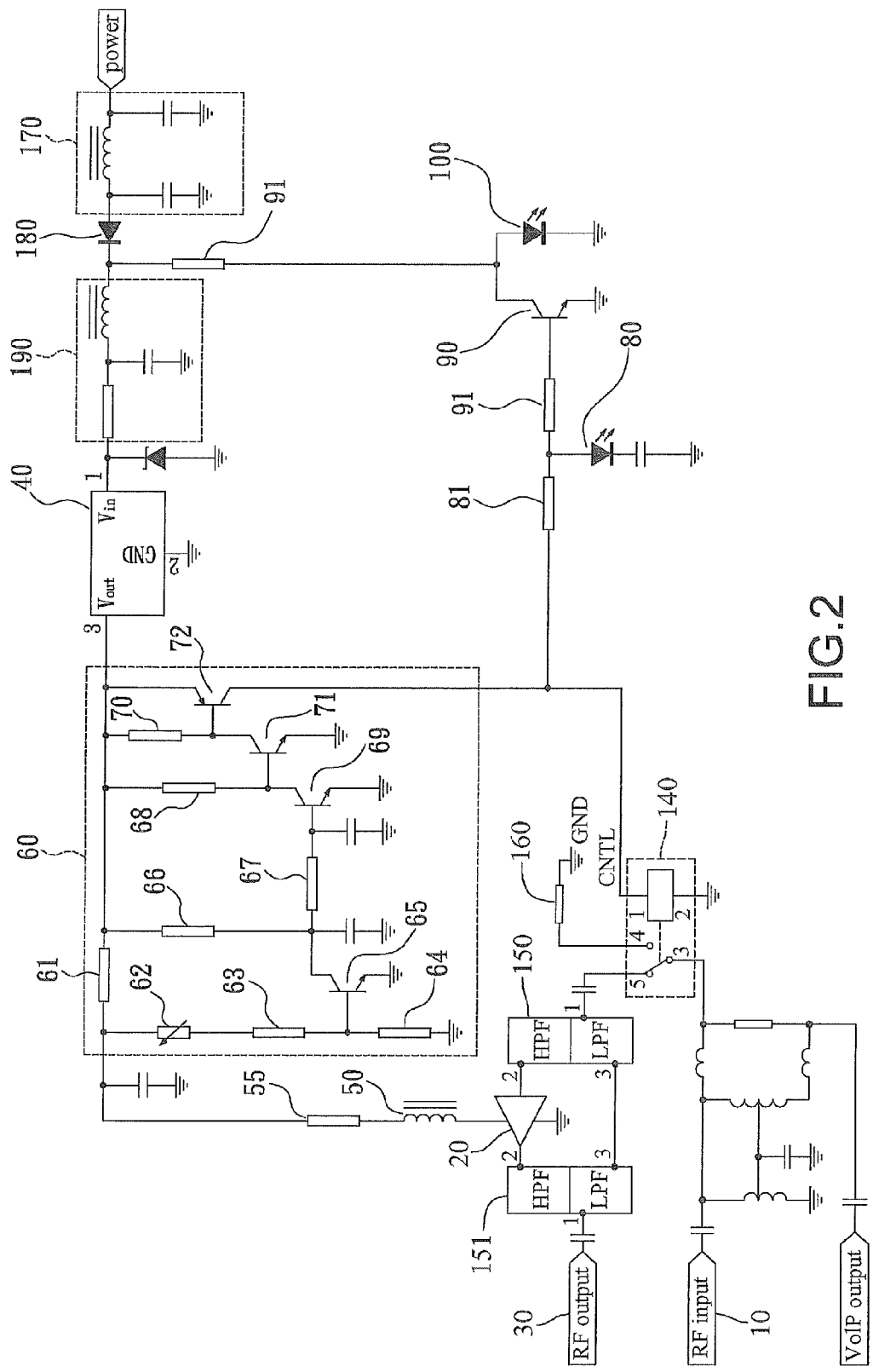
FIG. 2 is a schematic view depicts a distribution amplifier with intellectual signaling according to an embodiment.
Figure 3:
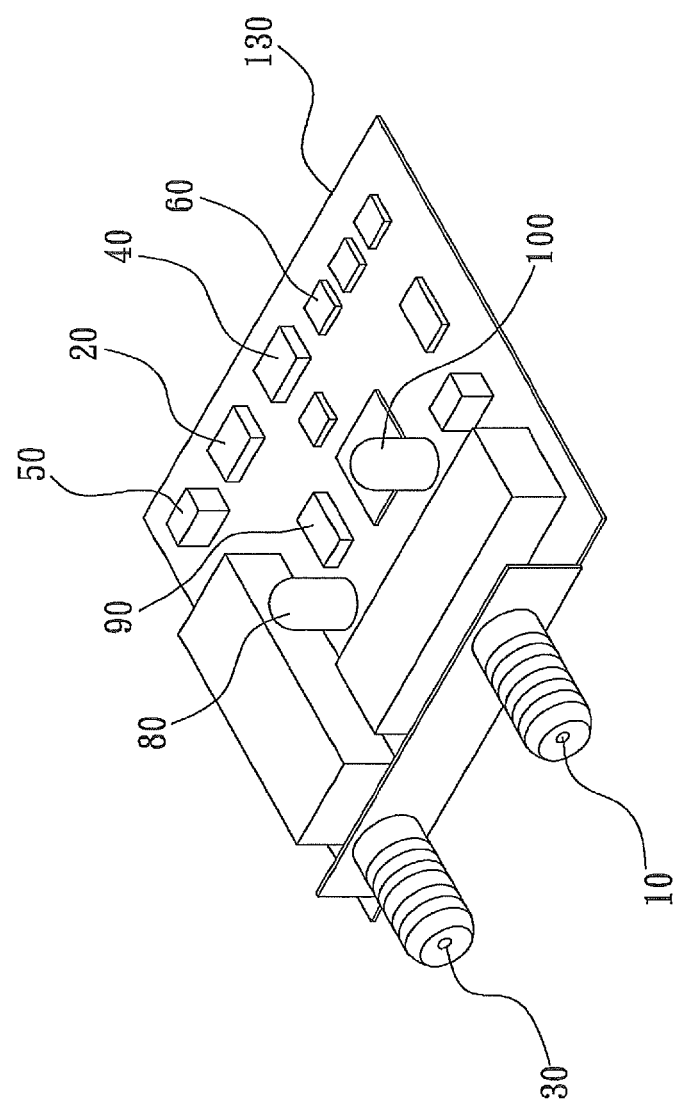
FIG. 3 is a schematic view depicts a distribution amplifier with intellectual signaling further including a printed circuit board according to an embodiment.
Figure 4:
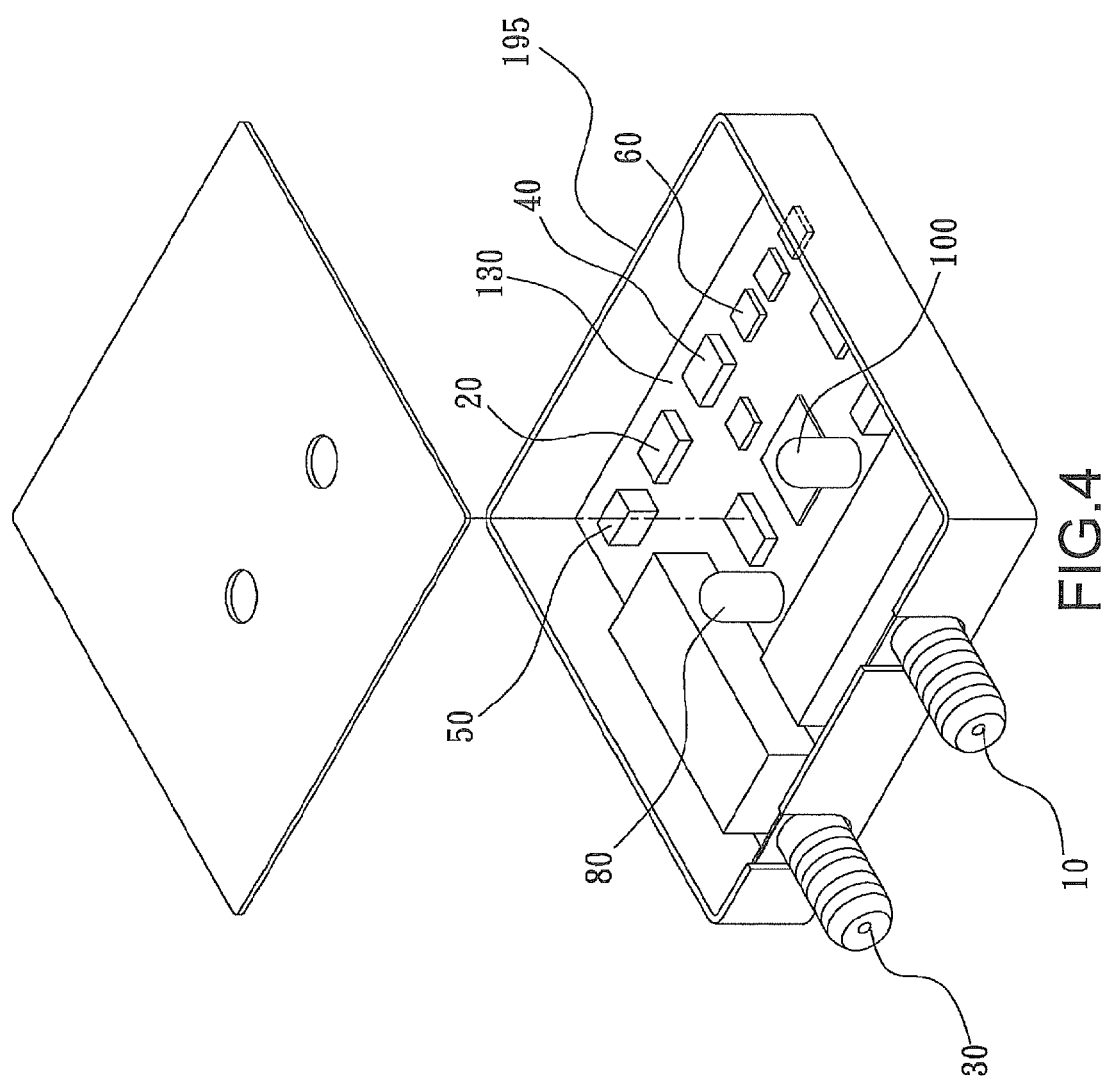
FIG. 4 is a schematic view depicts a distribution amplifier with intellectual signaling further including a casing according to an embodiment.

Please refer to FIGS. 2 to 4 together. FIG. 2 is a schematic view depicts a distribution amplifier with intellectual signaling according to an embodiment. FIG. 3 is a schematic view depicts a distribution amplifier with intellectual signaling further including a printed circuit board according to an embodiment. FIG. 4 is a schematic view depicts a distribution amplifier with intellectual signaling further including a casing according to an embodiment. The present disclosure generally describes a distribution amplifier with intellectual signaling having a plurality of indicating lamps for signaling whether the distribution amplifier is operating in a normal operation state or whether the distribution amplifier has failed.

As shown in FIGS. 2 to 4, in an embodiment, a distribution amplifier with intellectual signaling comprises a first connector 10, a first amplifier 20, a second connector 30, a power regulator 40, an inductive coil 50, a voltage detecting circuit 60, a first indicating lamp 80, a second amplifier 90 and a second indicating lamp 100.

In this embodiment, the first connector 10 may be a coaxial radio-frequency connector (f-connector) or an RJ-45 connector of an Ethernet, but not limited to the disclosure. The first connector 10 may be used for transmitting an RF signal to a cable (not shown). The range of the frequency of the signal may be from about 5 MHz to about 1,002 MHz, but not limited to the disclosure.

The first amplifier is generally provided to amplify the RF signal received by the first connector. Specifically, the first amplifier 20 includes an input terminal, an output terminal and a power input terminal. The input terminal of the first amplifier 20 is coupled to the first connector 10, and the first amplifier 20 is adapted to amplify the RF signal. The first amplifier 20 may be a transistor circuit, but not limited to the disclosure.

The second connector 30 may be an f-connector or an RJ-45 connector of an Ethernet, but not limited to the disclosure. The second connector 30 is coupled to the output terminal of the first amplifier 20 for outputting an amplified RF signal during normal operation state. The arrangement of the first connector 10 and the second connector 30 may be adapted such that the first connector 10 and the second connector 30 may be the same (i.e. both are the f-connectors or the RJ-45 connectors) or different from other (i.e. one is f-connector and the other is RJ-45 connector).

The power regulator is generally configured to stabilize direct current power. Specifically, the power regulator 40 includes a first terminal, a second terminal and a third terminal. The first terminal is connected to a first direct current power. The second terminal is grounded. The third terminal is configured to output a second direct current power after the voltage of the first direct current power is stabilized by the power regulator. In this embodiment, the first direct current power is DC+12V, and the second direct current power is DC+9V, but not limited to the disclosure.

The inductive coil is generally configured to measure the voltage of the power input terminal. Specifically, the inductive coil 50 includes a first terminal and a second terminal. The first terminal of the inductive coil is connected to the second direct current power from the third terminal of the power regulator 40. The second terminal of the inductive coil is coupled to the power input terminal of the first amplifier 20 and is configured to measure the voltage of the power input terminal. When the first amplifier 20 is in a normal operation state, a first voltage (i.e. +8.5V to +9.0V, but is not limited to the disclosure) may be detected by the inductive coil 50. When the first amplifier 20 fails, a second voltage (i.e. +4.5V to +5.6V, but is not limited to the disclosure) may be detected by the inductive coil 50.

The voltage detecting circuit is adapted to output a control signal based on the voltage detected by the inductive coil. Specifically, the voltage detecting circuit 60 includes a terminal which is coupled to the second direct current power. The voltage detecting circuit 60 is configured to output a control signal CNTL according to the voltage detected by the inductive coil 50. When the first voltage (signaling a normal operation state) is detected by the inductive coil 50, the voltage detecting circuit 60 is adapted to output the control signal CNTL with a high voltage level. When the second voltage (signaling that the first amplifier has failed) is detected by the inductive coil 50, the voltage detecting circuit 60 outputs the control signal CNTL with a low voltage level.

A first indicating lamp 80 is provided to signal whether the distribution amplifier is operating in a normal operation state. Specifically, the first indicating lamp 80 includes a first terminal and a second terminal. The first terminal is adapted to receive the control signal CNTL from the voltage detecting circuit. The second terminal is grounded (GND). In this embodiment, the first indicating lamp 80 may be a green light emitting diode (LED), but not limited to the disclosure. When the first indicating lamp 80 receives a control signal at a high voltage level (signaling a normal operation state), the first indicating lamp 80 is turned on or is illuminated. When the first indicating lamp 80 receives a control signal at a low voltage level (signaling that the first amplifier has failed), the first indicating lamp 80 is turned off or is not illuminated.

A second indicating lamp 100 is further provided to signal whether the distribution has failed. Specifically, a second amplifier 90 includes a first terminal, a second terminal and a third terminal. The first terminal of the second amplifier 90 is adapted to receive the control signal CNTL from the voltage detecting circuit and is coupled to the first terminal of the first indicating lamp 80. The second terminal of the second amplifier 90 is grounded. The third terminal is of the second amplifier 90 is adapted to receive the first direct current power via a resistor 91. In this embodiment, the second amplifier 90 is an NPN transistor, the first terminal is a base, the second terminal is an emitter, and the third terminal is a collector, but not limited to the disclosure.

The second indicating lamp 100 is coupled to the second amplifier 90, and includes a first terminal and a second terminal. The first terminal of the second indicating lamp 100 is coupled to the third terminal of the second amplifier 90. The second terminal of the second indicating lamp 100 is grounded. In this embodiment, the second indicating lamp 100 is a red emitting diode, but not limited to the disclosure. When the second amplifier receives a control signal at a high voltage level (signaling a normal operation state), the second amplifier is conducted such that the second indicating lamp is turned off. When the second amplifier receives a control signal at a low voltage level (signaling that the first amplifier has failed), the second amplifier is cut off such that the second indicating lamp is turned on.

In summary, the first and second indicating lamps are adapted to signal whether the distribution amplifier is operating in a normal operation state or whether the distribution amplifier has failed in the following manner. When the control signal CNTL is at the high voltage level, the first indicating lamp 80 is turned on and the voltage between the base and the emitter of the second amplifier 90 is above 0.7 V such that the second amplifier 90 is conducted. After that, the second indicating lamp is turned off when the voltage between the base and the emitter of the second amplifier 90 is below 0.7 V because of the conduction of the second amplifier 90. That is, it can be understood that the distribution amplifier is in a normal operation state (the distribution amplifier is operated normally). When the control signal is at the low voltage level, the first indicating lamp 80 is turned off, and the voltage between the base and the emitter of the second amplifier 90 is below 0.7 V such that the second amplifier 90 is cut off and the second indicating lamp 100 is turned on. That is, it can be understood that the distribution amplifier is in a failed state (the distribution amplifier is failed). Therefore, this arrangement facilitates the determination of whether the distribution amplifier operates normally according to the signaling of the first indicating lamp 80 and the second indicating lamp 100.

Besides, in this embodiment, the distribution amplifier with intellectual signal further comprises a first resistor 55 positioned between the power regulator 40 and the inductive coil 50. The first resistor 55 includes a first terminal and a second terminal. The first terminal is coupled to the second direct current power. The second terminal is coupled to the first terminal of the inductive coil 50 for dividing the voltage of the power with the inductive coil 50, thereby supplying direct current power needed by the first amplifier 20.

Moreover, in this embodiment, the voltage detecting circuit 60 further comprises a second resistor 61, a variable resistor 62, a third resistor 63, a fourth resistor 64, a first transistor 65, a fifth resistor 66, a sixth resistor 67, a seventh resistor 68, a second transistor 69, an eighth resistor 70, a third transistor 71 and a fourth transistor 72.

In this embodiment, the second resistor 61 includes a first terminal and a second terminal. The first terminal is coupled to the first terminal of the first resistor 55. The second terminal is coupled to the second direct current power. The second resistor 61 may form a voltage divider with the first resistor 55 and the inductive coil 50.

The variable resistor 62 includes a first terminal and a second terminal. The first terminal is coupled to the first resistor 55 and the first terminal of the second resistor 61. The second terminal is coupled to a first terminal of the third resistor 63.

The third resistor 63 includes the first terminal and a second terminal. The first terminal is coupled to the second terminal of the variable resistor 62. The second terminal is coupled to a first terminal of the fourth resistor 64.

The fourth resistor 64 includes the first terminal and a second terminal. The first terminal is coupled to the second terminal of the third resistor 63. The second terminal is grounded.

The first transistor 65 includes a first terminal, a second terminal and a third terminal. The first terminal is coupled to the second terminal of the third resistor 63 and the first terminal of the fourth resistor 64. The second terminal is grounded. The third terminal is coupled to a second terminal of the fifth resistor 66. The variable resistor 62, the third resistor 63 and the fourth resistor 64 are configured to adjust the voltage needed by the first transistor 65. In this embodiment, the first transistor 65 is an NPN transistor. The first terminal is a base, the second terminal is an emitter, and the third terminal is a collector, but the NPN transistor, the base, the emitter and the collector are not limited to the disclosure.

The fifth resistor 66 includes a first terminal and a second terminal. The first terminal is coupled to the second direct current power. The second terminal is coupled to the third terminal of the first transistor 65.

The sixth resistor 67 includes a first terminal and a second terminal. The first terminal is coupled to the second terminal of the fifth resistor 66 and the third terminal of the first transistor 65. The second terminal is coupled to a first terminal of the second transistor 69.

The seventh resistor 68 includes a first terminal and a second terminal. The first terminal is coupled to the second direct current power. The second terminal is coupled to a third terminal of the second transistor 69.

The second transistor 69 includes the first terminal, a second terminal and the third terminal. The first terminal is coupled to the second terminal of the sixth resistor 67. The second terminal is grounded. The third terminal is coupled to the second terminal of the seventh resistor 68. In this embodiment, the second transistor 69 is an NPN transistor. The first terminal is a base, the second terminal is an emitter, and the third terminal is a collector, but the NPN transistor, the base, the emitter and the collector are not limited to the disclosure.

The eighth resistor 70 includes a first terminal and a second terminal. The first terminal is coupled to the second direct current power. The second terminal is coupled to a third terminal of the third transistor 71.

The third transistor 71 includes a first terminal, a second terminal and the third terminal. The first terminal is coupled to the first terminal of the seventh resistor 68 and the third terminal of the second transistor 69. The second terminal is grounded. The third terminal is coupled to the second terminal of the eighth resistor 70. In this embodiment, the third transistor 71 is an NPN transistor. The first terminal is a base, the second terminal is an emitter, and the third terminal is a collector, but the NPN transistor, the base, the emitter and the collector are not limited to the disclosure.

The fourth transistor 72 includes a first terminal, a second terminal and a third terminal. The first terminal is coupled to the second terminal of the eighth resistor 70 and the third terminal of the third transistor 71. The second terminal is coupled to the second direct current power. The third terminal is configured to output the control signal CNTL to the first indicating lamp 80 and the second indicating lamp 90. In this embodiment, the fourth transistor 72 is a PNP transistor. The first terminal is a base, the second terminal is an emitter, and the third terminal is a collector, but the PNP transistor, the base, the emitter and the collectors are not limited to the disclosure.

The principles of operation of the distribution amplifier with intellectual signaling are described as follows:

When the first amplifier 20 operates normally, the voltage of 8.5 V to 9.0 V across the inductive coil 50 may be detected. After the voltage of 8.5 V to 9.0 V is divided by the variable resistor 62, the third resistor 63 and the fourth resistor 64, the first transistor 65 may be conducted, the second transistor 69 may be cut off, and the third transistor 71 and the fourth transistor 72 may be conducted such that the control signal CNTL with the high voltage level is outputted by the fourth transistor 72. After the voltage is divided by the ninth resistor 81 and the tenth resistor 91, the first indicating lamp 80 is illuminated or turned on (displaying green light) and the second amplifier 90 is conducted such that the second indicating lamp 100 is turned off. When the first amplifier 20 fails, the voltage of 4.5 V to 5.6 V across the inductive coil 50 may be detected. After the voltage of 4.5 V to 5.6 V is divided by the variable resistor 62, the third resistor 63 and the fourth resistor 64, the first transistor 65 may be cut off, the second transistor 69 may be conducted, and the third transistor 71 and the fourth transistor 72 may be cut off such that the control signal CNTL with the low voltage level is outputted by the fourth transistor 72. Therefore, the first indicating lamp 80 is turned off and the second amplifier 90 is cut off such that the second indicating lamp 100 is turned on or illuminated (displaying red light). In this way, engineers may determine whether the distribution amplifier operates normally according to the color signaling of the first indicating lamp 80 and the second indicating lamp 100.

As shown in FIG. 3, in this embodiment, the distribution amplifier with intellectual signaling further comprises a printed circuit board 130 for carrying the first connector 10, the first amplifier 20, the second connector 30, the power regulator 40, the inductive coil 50, the voltage detecting circuit 60, the first indicating lamp 80, the second amplifier 90 and the second indicating lamp 100.

Besides, in this embodiment, the distribution amplifier with intellectual signaling further comprises a ninth resistor 81 and a tenth resistor 91. The ninth resistor 81 is positioned on the printed circuit board 130 and between the voltage detecting circuit 60 and the first indicating lamp 80. The ninth resistor 81 includes a first terminal and a second terminal. The first terminal is coupled to the third terminal of the fourth transistor 72. The second terminal is coupled to the first terminal of the first indicating lamp 80 for supplying the divided voltage needed by the first indicating lamp 80. The tenth resistor 91 is positioned on the printed circuit board 130 and between the first indicating lamp 80 and the second amplifier 90. The tenth resistor 91 includes a first terminal and a second terminal. The first terminal is coupled to the second terminal of the ninth resistor 81. The second terminal is coupled to the first terminal of the second amplifier 90 for supplying the divided voltage needed by the second amplifier 90.

Furthermore, in this embodiment, the distribution amplifier with intellectual signaling further comprises a switch 140, a first duplexer 150, a second duplexer 151 and an impedance resistor 160. The switch 140 is positioned on the printed circuit board 130. The switch 140 includes a first terminal, a second terminal, a third terminal, a fourth terminal and a fifth terminal.

The first terminal of the switch 140 is coupled to the control signal CNTL. The second terminal is grounded. The third terminal is coupled to the first connector 10. The fourth terminal is coupled to the impedance resistor 160. The fifth terminal is coupled to the first duplexer 150. The switch 140 is an electrical switch, such as a relay, but not limited to the disclosure.

The first duplexer 150 is positioned on the printed circuit board 130 and between the switch 140 and the first amplifier 20. The first duplexer 150 includes a first terminal, a second terminal and a third terminal. The first terminal is coupled to the switch 140. The second terminal is coupled to the input terminal of the first amplifier 20.

The second duplexer 151 is positioned on the printed circuit board 130 and between the second connector 30 and the first amplifier 20. The second duplexer 151 includes a first terminal, a second terminal and a third terminal. The first terminal is coupled to the second connector 30. The second terminal is coupled to the output terminal of the first amplifier 20. The third terminal is coupled to the third terminal of the first duplexer 150.

The impedance resistor 160 is positioned on the printed circuit board 130. The impedance resistor 160 includes a first terminal and a second terminal. The first terminal is coupled to the fourth terminal of the switch 140. The second terminal is grounded. The impedance resistor 160 is resistor with 75 ohms, but not limited to the disclosure.

When the power is turned on, the switch 140 is switched to the position where the third terminal and the fifth terminal of the switch 140 are conducted such that the RF signal is outputted by the second connector 30 after being amplified by the first amplifier 20. When the power is interrupted or fails, the switch 140 is switched to another position where the third terminal and the fourth terminal of the switch 140 are conducted such that the RF signal is stopped outputting, and needed matched impedance of 75 ohms is supplied by the impedance resistor 160.

Moreover, in this embodiment, the distribution amplifier with intellectual signaling further comprises a first filter circuit 170, a rectifier diode 180 and a second filter circuit 190.

The first filter circuit 170 includes a first terminal coupled to the first direct current power for filtering the first current power.

The rectifier diode 180 includes a first terminal and a second terminal. The first terminal is coupled to the first filter circuit 170 and the second terminal is configured to output the first direct current power for supplying 0.7 V voltage to the first direct current power.

The second filter circuit 190 includes a first terminal and a second terminal. The first terminal is coupled to the second terminal of the rectifier diode 180 and the second terminal is coupled to the first terminal of the power regulator 40 for filtering the first direct current power anew.

During operation, when the first amplifier 20 operates normally, the voltage of 8.5 V to 9.0 V across the inductive coil 50 may be detected. After the voltage of 8.5 V to 9.0 V is divided by the variable resistor 62, the third resistor 63 and the fourth resistor 64, the first transistor 65 may be conducted, the second transistor 69 may be cut off, and the third transistor 71 and the fourth transistor 72 may be conducted such that the control signal CNTL with the high voltage level is outputted by the fourth transistor 72. After the voltage is divided by the ninth resistor 81 and the tenth resistor 91, the first indicating lamp 80 is illuminated or turned on (displaying green light) and the second amplifier 90 is conducted such that the second indicating lamp 100 is turned off. When the first amplifier 20 fails, the voltage of 4.5 V to 5.6 V across the inductive coil 50 may be detected. After the voltage of 4.5 V to 5.6 V is divided by the variable resistor 62, the third resistor 63 and the fourth resistor 64, the first transistor 65 may be cut off, the second transistor 69 may be conducted, and the third transistor 71 and the fourth transistor 72 may be cut off such that the control signal CNTL with the low voltage level is outputted by the fourth transistor 72. Therefore, the first indicating lamp 80 is turned off and the second amplifier 90 is cut off such that the second indicating lamp 100 is illuminated or turned on (displaying red light). In this way, the engineers may determine whether the distribution amplifier operates normally according to the color signaling of the first indicating lamp 80 and the second indicating lamp 100. Thus, compared with the conventional residential amplifier, the distribution amplifier with intellectual signaling according to the embodiment has an advantage of determining whether the amplifier is in normal operation easily.

As shown in FIG. 4, in this embodiment, the distribution amplifier with intellectual signaling further includes a casing 105 for containing the printed circuit board 130, the first connector 10 and the second connector 30. In this embodiment, the casing 105 is made of plastic, but not limited to the embodiment.

Therefore, the distribution amplifier with intellectual signaling according to the embodiment has a function of determining whether the amplifier is in normal operation easily.

In summary, by the implementation of the distribution amplifier with intellectual signaling of the disclosure comprising a voltage detecting circuit, a first indicating lamp and a second indicating lamp, the distribution amplifier with intellectual signaling has an advantage of displaying whether the amplifier operates normally or not effectively. Therefore, the disclosure is patentable over the conventional amplifier.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A distribution amplifier with intellectual signaling, comprising:
    a first amplifier, including an input terminal for receiving a radio-frequency signal, an output terminal and a power input terminal, the first amplifier being configured to amplify the radio-frequency signal by the input terminal and output the amplified radio-frequency signal by the output terminal;
    power regulator, including a first terminal and a second terminal, the first terminal being coupled to a first direct current power and, and the power regulator being configured to stabilize voltage of the first direct current power and output a second direct current power from the second terminal after the voltage of the first direct current power being stabilized;
    an inductive coil, including a first terminal and a second terminal, the first terminal being coupled to the second direct current power, the second terminal being coupled to the power input terminal of the first amplifier, and the inductive coil being configured to measure the voltage of the power input terminal, wherein when the first amplifier is in a normal operation state, a first voltage is detected by the inductive coil, and when the first amplifier fails, a second voltage is detected by the inductive coil;
    a voltage detecting circuit, including a terminal coupled to the second direct current power, the voltage detecting circuit being configured to output a control signal according to the voltage detected by the inductive coil, wherein when the first voltage is detected by the inductive coil, the voltage detecting circuit outputs the control signal with a high voltage level, and when the second voltage is detected by the inductive coil, the voltage detecting circuit outputs the control signal with a low voltage level;
    a first indicating lamp, including a terminal coupled to the voltage detecting circuit for receiving the control signal, wherein when the first indicating lamp receives the control signal at the high voltage level, the first indicating lamp is adapted to be illuminated, and wherein when the first indicating lamp receives the control signal at the low voltage level, the first indicating lamp is adapted to not be illuminated.

2. The distribution amplifier with intellectual signaling according to claim 1, further including:
    a second amplifier, including a first terminal, and a second terminal, the first terminal being coupled to the voltage detecting circuit for receiving the control signal, and a third terminal being connected to the first direct current power; and
    a second indicating lamp, including a terminal coupled to the third terminal of the second amplifier; wherein when the second amplifier receives the control signal at the high voltage level, the second amplifier is conducted such that the second indicating lamp is turned off, and wherein when the second amplifier receives the control signal at the low voltage level, the second amplifier is cut off such that the second indicating lamp is illuminated.

3. The distribution amplifier with intellectual signaling according to claim 1, further comprising a first and second connector, each respectively coupled to the input terminal and output terminal of the first amplifier.

4. The distribution amplifier with intellectual signaling according to claim 3, wherein the first connector and the second connector are coaxial radio-frequency connectors (f-connectors) or RJ-45 connectors of an Ethernet.

5. The distribution amplifier with intellectual signaling according to claim 1, wherein the frequency of the radio-frequency signal is in the range of 5 MHz to 1,002 MHz.

6. The distribution amplifier with intellectual signaling according to claim 2, wherein the first amplifier and the second amplifier are transistors, the first terminal of the second amplifier is a base, the second terminal of the second amplifier is an emitter, and the third terminal of the second amplifier is a collector.

7. The distribution amplifier with intellectual signaling according to claim 2, wherein the first indicating lamp is a green light emitting diode, the second indicating diode is a red emitting diode, the first voltage is a direct current in the range of 8.5 V to 9V, and the second voltage is a direct current in the range of 4.5V to 5.6V.

8. The distribution amplifier with intellectual signaling according to claim 2, further comprising a first resistor positioned between the power regulator and the inductive coil, the first resistor including a first terminal and a second terminal, the first terminal being coupled to the second direct current power, the second terminal being coupled to the first terminal of the inductive coil for supplying direct current power to the first amplifier.

9. The distribution amplifier with intellectual signaling according to claim 8, wherein the voltage detecting circuit comprises:
a second resistor, including a first terminal and a second terminal, the first terminal being coupled to the first terminal of the first resistor, the second terminal being coupled to the second direct current power;
a variable resistor, including a first terminal and a second terminal, the first terminal being coupled to the first resistor and the first terminal of the second resistor;
a third resistor, including a first terminal and a second terminal, the first terminal being coupled to the second terminal of the variable resistor; a fourth resistor, including a first terminal and a second terminal, the first terminal being coupled to the second terminal of the third resistor, the second terminal being grounded;
a first transistor, including a first terminal, a second terminal and a third terminal, the first terminal being coupled to the second terminal of the third resistor and the first terminal of the fourth resistor, the second terminal being grounded, wherein the variable resistor, the third resistor and the fourth resistor are configured to adjust the voltage needed by the first transistor;
a fifth resistor, including a first terminal and a second terminal, the first terminal being coupled to the second direct current power and the second terminal being coupled to the third terminal of the first transistor;
a sixth resistor, including a first terminal and a second terminal, the first terminal being coupled to the second terminal of the fifth resistor and the third terminal of the first transistor;
a seventh resistor, including a first terminal and a second terminal, the first terminal being coupled to the second direct current power;
a second transistor, including a first terminal, a second terminal and a third terminal, the first terminal being coupled to the second terminal of the sixth resistor, the second terminal being grounded, and the third terminal being coupled to the second terminal of the seventh resistor;
an eighth resistor, including a first terminal and a second terminal, the first terminal being coupled to the second direct current power;
a third transistor, including a first terminal, a second terminal and a third terminal, the first terminal being coupled to the second terminal of the seventh resistor and the third terminal of the second transistor, the second terminal being grounded, and the third terminal being coupled to the second terminal of the eighth resistor; and
a fourth transistor, including a first terminal, a second terminal and a third terminal, the first terminal being coupled to the second terminal of the eighth resistor and the third terminal of the third transistor, the second terminal being coupled to the second direct current power, and the third terminal being configured to output the control signal to the first indicating lamp and the second indicating lamp.

10. The distribution amplifier with intellectual signaling according to claim 9, wherein the first transistor, the second transistor, the third transistor are NPN transistors, the fourth transistor is PNP transistor, wherein the first terminals of the first transistor, the second transistor, the third transistor and the fourth transistor are bases, the second terminals of the first transistor, the second transistor, the third transistor and the fourth transistor are emitters, and the third terminals of the first transistor, the second transistor, the third transistor and the fourth transistor are collectors.

11. The distribution amplifier with intellectual signaling according to claim 2, further comprising a printed circuit board for carrying a first connector, the first amplifier, a second connector, the power regulator, the inductive coil, the voltage detecting circuit, the first indicating lamp, the second amplifier and the second indicating lamp.

12. The distribution amplifier with intellectual signaling according to claim 11, further comprising:
a switch, including a first terminal, a second terminal, a third terminal, a fourth terminal and a fifth terminal, the switch being positioned on the printed circuit board, the first terminal being coupled to the control signal, the second terminal being grounded, and the third terminal being coupled to the first connector;
a first duplexer, including a first terminal, a second terminal and a third terminal, the first duplexer being positioned on the printed circuit board and between the switch and the first amplifier, the first terminal being coupled to the fifth terminal of the switch and the second terminal being coupled to the input terminal of the first amplifier;
a second duplexer, including a first terminal, a second terminal and a third terminal, the second duplexer being positioned on the printed circuit board and between the second connector and the first amplifier, the first terminal being coupled to the second connector, the second terminal is coupled to the output terminal of the first amplifier and the third terminal is coupled to the third terminal of the first duplexer; and
an impedance resistor, including a first terminal and a second terminal, the impedance resistor being positioned on the printed circuit board, the first terminal being coupled to the fourth terminal of the switch, and the second terminal being grounded;
wherein when power is turned on, the switch is switched to conduct the third terminal and the fifth terminal of the switch such that the radio-frequency signal is outputted by the second connector after being amplified by the first amplifier; when the power is interrupted or fails, the switch is switched to conduct the third terminal and the fourth terminal of the switch such that the radio-frequency signal is stopped outputting, and the impedance resistor supplies needed matched impedance.

13. The distribution amplifier with intellectual signaling according to claim 12, wherein the switch is an electrical switch and the impedance resistor is a resistor of 75 ohms.

14. The distribution amplifier with intellectual signaling according to claim 9, further comprising;
a ninth resistor, including a first terminal and a second terminal, the ninth resistor being positioned between the voltage detecting circuit and the first indicating lamp, the first terminal being coupled to the control signal of the voltage detecting circuit, the second terminal being coupled to the first terminal of the first indicating lamp for supplying divided voltage needed by the first indicating lamp; and a tenth resistor, including a first terminal and a second terminal, the tenth resistor being positioned between the first indicating lamp and the second amplifier, the first terminal being coupled to the second terminal of the ninth resistor, and the second terminal being coupled to the first terminal of the second amplifier for supplying divided voltage needed by the second amplifier.

15. The distribution amplifier with intellectual signaling according to claim 11, further comprising:

a first filter circuit, including a first terminal coupled to the first direct current power;

a rectifier diode, including a first terminal and a second terminal, the first terminal being coupled to the first filter circuit and the second terminal being configured to output the first direct current power; and a second filter circuit, including a first terminal and a second terminal, the first terminal being coupled to the second terminal of the rectifier diode, and the second terminal being coupled to the first terminal of the power regulator.

16. The distribution amplifier with intellectual signaling according to claim 15, wherein the first direct current power is DC+12V, and the second direct current power is DC+9V.

17. The distribution amplifier with intellectual signaling according to claim 14, further comprising a casing for containing the printed circuit board, the first connector and the second connector.

18. The distribution amplifier with intellectual signaling according to claim 17, wherein the casing is made of plastic.

19. A distribution amplifier with intellectual signaling, comprising:

a first amplifier, including an input terminal for receiving a radio-frequency signal, an output terminal and a power input terminal, the first amplifier being configured to amplify the radio-frequency signal by the input terminal and output the amplified radio-frequency signal by the output terminal;

a power regulator, including a first terminal and a second terminal, the first terminal being coupled to a first direct current power and, and the power regulator being configured to stabilize voltage of the first direct current power and output a second direct current power from the second terminal after the voltage of the first direct current power being stabilized;

an inductive coil, including a first terminal and a second terminal, the first terminal being coupled to the second direct current power, the second terminal being coupled to the power input terminal of the first amplifier, and the inductive coil being configured to measure the voltage of the power input terminal, wherein when the first amplifier is in a normal operation state, a first voltage is detected by the inductive coil, and when the first amplifier fails, a second voltage is detected by the inductive coil;

a voltage detecting circuit, including a terminal coupled to the second direct current power, the voltage detecting circuit being configured to output a control signal according to the voltage detected by the inductive coil, wherein when the first voltage is detected by the inductive coil, the voltage detecting circuit outputs the control signal with a high voltage level, and when the second voltage is detected by the inductive coil, the voltage detecting circuit outputs the control signal with a low voltage level;

a second amplifier, including a first terminal, and a second terminal, the first terminal being coupled to the voltage detecting circuit for receiving the control signal, and a third terminal being connected to the first direct current power; and an indicating lamp, including a terminal coupled to the third terminal of the second amplifier; wherein when the second amplifier receives the control signal at the high voltage level, the second amplifier is conducted such that the indicating lamp is turned off, and wherein when the second amplifier receives the control signal at the low voltage level, the second amplifier is cut off such that the indicating lamp is illuminated.

* * * * *